United States Patent
Song et al.

(10) Patent No.: US 10,013,307 B1
(45) Date of Patent: *Jul. 3, 2018

(54) SYSTEMS AND METHODS FOR DATA STORAGE DEVICES TO USE EXTERNAL RESOURCES

(71) Applicant: Marvell International Ltd.

(72) Inventors: Jong-uk Song, San Jose, CA (US); Yun Chan Myung, Fremont, CA (US)

(73) Assignee: MARVELL INTERNATIONAL LTD., Hamilton (BM)

( * ) Notice: Subject to any disclaimer, the term of this patent is extended or adjusted under 35 U.S.C. 154(b) by 300 days.

This patent is subject to a terminal disclaimer.

(21) Appl. No.: 14/967,698

(22) Filed: Dec. 14, 2015

Related U.S. Application Data

(63) Continuation of application No. 13/744,466, filed on Jan. 8, 2013, now Pat. No. 9,213,632.

(60) Provisional application No. 61/605,134, filed on Feb. 29, 2012.

(51) Int. Cl.
| | |
|---|---|
| *G06F 12/02* | (2006.01) |
| *G06F 12/06* | (2006.01) |
| *G06F 12/10* | (2016.01) |
| *G06F 11/10* | (2006.01) |
| *G06F 3/06* | (2006.01) |
| *G11C 29/52* | (2006.01) |

(52) U.S. Cl.
CPC ........ *G06F 11/1068* (2013.01); *G06F 3/0619* (2013.01); *G06F 3/0638* (2013.01); *G06F 3/0647* (2013.01); *G06F 3/0685* (2013.01); *G11C 29/52* (2013.01)

(58) Field of Classification Search
CPC .. G06F 11/1068; G06F 3/0619; G06F 3/0638; G06F 3/0647; G06F 3/0685; G06F 12/02; G06F 12/0246; G06F 12/0292; G06F 12/06; G06F 12/10; G06F 12/1009; G06F 2212/1041; G06F 2212/7201; G11C 29/52; G11C 29/44; G11C 29/4401
See application file for complete search history.

(56) References Cited

U.S. PATENT DOCUMENTS

| | | | |
|---|---|---|---|
| 7,958,430 B1* | 6/2011 | Kolokowsky | G06F 11/1068 714/763 |
| 2004/0123219 A1* | 6/2004 | Cucchi | H03M 13/2909 714/760 |
| 2005/0120265 A1* | 6/2005 | Pline | G06F 11/1008 714/6.32 |
| 2005/0144360 A1 | 6/2005 | Bennett et al. | |
| 2006/0053246 A1 | 3/2006 | Lee | |

(Continued)

*Primary Examiner* — Yaima Rigol

(57) ABSTRACT

System and methods are provided for storing address-mapping data from a storage device on a processing system. Address-mapping data is stored on a non-volatile memory of a storage device, the address-mapping data indicating mapping from logical addresses to physical addresses of the non-volatile memory of the storage device. The address-mapping data is transmitted from the non-volatile memory to a processing system. In response to a request to access a logical address of the non-volatile memory, part of the address-mapping data is transferred from the processing system to a volatile memory of the storage device, the part of the address-mapping data being associated with a mapping from the logical address to a physical address of the non-volatile memory.

10 Claims, 7 Drawing Sheets

(56) References Cited

U.S. PATENT DOCUMENTS

| | | |
|---|---|---|
| 2006/0184723 A1 | 8/2006 | Sinclair et al. |
| 2008/0189485 A1 | 8/2008 | Jung et al. |
| 2009/0113121 A1 | 4/2009 | Lee et al. |
| 2010/0023800 A1 | 1/2010 | Harari et al. |
| 2010/0095053 A1 | 4/2010 | Bruce et al. |
| 2010/0180145 A1 | 7/2010 | Chu |
| 2010/0199149 A1* | 8/2010 | Weingarten ......... G06F 11/1068 |
| | | 714/773 |
| 2010/0235565 A1 | 9/2010 | Ton-That et al. |
| 2010/0235713 A1* | 9/2010 | Lee .................... G06F 11/1072 |
| | | 714/763 |
| 2010/0268869 A1 | 10/2010 | Roh et al. |
| 2011/0209028 A1* | 8/2011 | Post ................... G06F 11/1068 |
| | | 714/758 |
| 2011/0225388 A1 | 9/2011 | Oh et al. |
| 2011/0296088 A1 | 12/2011 | Duzly et al. |
| 2012/0011299 A1 | 1/2012 | Mylly |
| 2012/0054419 A1 | 3/2012 | Chen et al. |
| 2012/0110249 A1 | 5/2012 | Jeong et al. |
| 2012/0110417 A1* | 5/2012 | D'Abreu ............. G06F 11/1012 |
| | | 714/773 |
| 2012/0124276 A1 | 5/2012 | Ahn et al. |
| 2012/0239855 A1 | 9/2012 | Tootoonchian et al. |
| 2012/0254511 A1 | 10/2012 | Yeh |

* cited by examiner

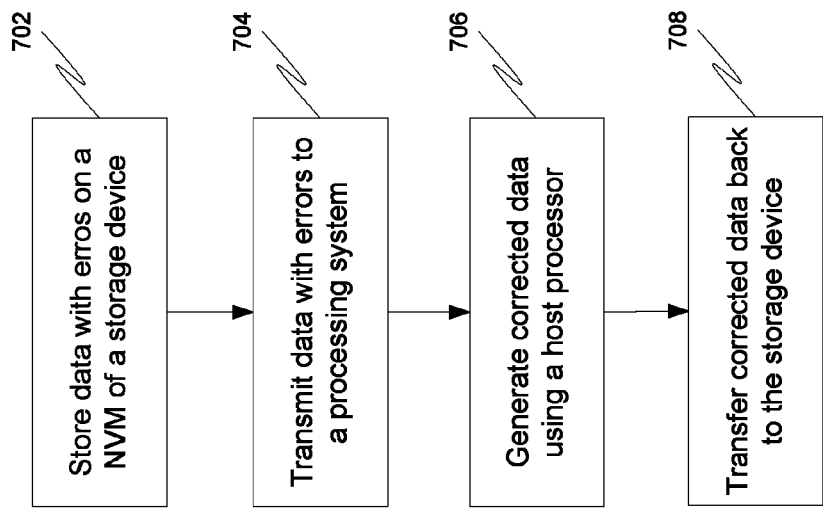

SYSTEMS AND METHODS FOR DATA STORAGE DEVICES TO USE EXTERNAL RESOURCES

CROSS-REFERENCE TO RELATED APPLICATIONS

This is a continuation of U.S. application Ser. No. 13/744,466, filed Jan. 18, 2013, issuing as U.S. Pat. No. 9,213,632, which claims priority from U.S. Provisional Application No. 61/605,134, filed Feb. 29, 2012. Both of the above applications are hereby incorporated herein by reference.

FIELD

The technology described in this patent document relates generally to data storage and more particularly to data storage devices.

BACKGROUND

Many electronic devices have been used for data storage, such as Hard Disk Drives (HDDs) and Solid State Drives (SSDs). Compared with HDDs, SSDs often have fewer mechanical defects and lower power consumption, and execute read and write operations more quickly in some instances.

As shown in FIG. 1, a data storage device 100 (e.g., a SSD) often includes a controller unit 102, a volatile memory 104, and a non-volatile memory 106. User data may be stored on the non-volatile memory 106 so that the user data will not be lost upon power failure. For example, the volatile memory 104 may include one or more dynamic random-access memory (DRAM) devices, and the non-volatile memory 106 may include one or more flash memory devices.

A flash memory device (e.g., a NAND flash memory) is often divided into storage blocks, and each storage block includes multiple pages. Typically, reading and programming a flash memory device can be performed on a page basis, but erasure can only be performed on a block basis. Moreover, a flash memory device may not support an in-place update. That is, a new page cannot be written over an old page at a same physical location unless the entire block is erased first. In addition, a flash memory device has a finite number of program-erase cycles before the integrity of the storage begins to deteriorate.

An internal software layer, Flash Translation Layer (FTL), is often implemented for managing data storage in the device 100. Major functions of an FTL include logic-to-physical address translation, garbage collection which reclaims used blocks, and wear leveling to increase lifespan of a flash memory device. In order to execute these functions, many data structures can be used for the FTL, such as an address mapping table (e.g., a page-level mapping or a block-level mapping), a pool of free blocks, and list of garbage blocks with erase counts. These data structures are typically called FTL metadata.

SUMMARY

In accordance with the teachings described herein, systems and methods are provided for storing address-mapping data from a storage device on a processing system. Address-mapping data is stored on a non-volatile memory of a storage device, the address-mapping data indicating mapping from logical addresses to physical addresses of the non-volatile memory of the storage device. The address-mapping data is transmitted from the non-volatile memory to a processing system. In response to a request to access a logical address of the non-volatile memory, part of the address-mapping data is transferred from the processing system to a volatile memory of the storage device, the part of the address-mapping data being associated with a mapping from the logical address to a physical address of the non-volatile memory.

For example, data with errors is stored on the non-volatile memory of the storage device. The data with errors is transmitted to the processing system. Corrected data is generated when a host processor of the processing system corrects the errors. The corrected data is transferred from the processing system to the storage device.

In yet another embodiment, a storage device includes a non-volatile memory, a controller unit, and a volatile memory. The non-volatile memory is configured to store address-mapping data, the address-mapping data indicating mapping from logical addresses to physical addresses of the non-volatile memory. The controller unit is configured to transmit the address-mapping data from the non-volatile memory to a processing system. The volatile memory is configured to receive part of the address-mapping data from the processing system in response to a request to access a logical address of the non-volatile memory, the part of the address-mapping data being associated with a mapping from the logical address to a physical address of the non-volatile memory.

For example, the non-volatile memory is further configured to store data with errors. The controller unit is further configured to transmit the data with errors to the processing system to generate corrected data when a host processor of the processing system corrects the errors. The non-volatile memory is further configured to receive the corrected data from the processing system.

BRIEF DESCRIPTION OF THE DRAWINGS

FIG. 7 illustrates an example flow chart for using an external processing system to perform error correction for a data storage device.

DETAILED DESCRIPTION

Figure 1:
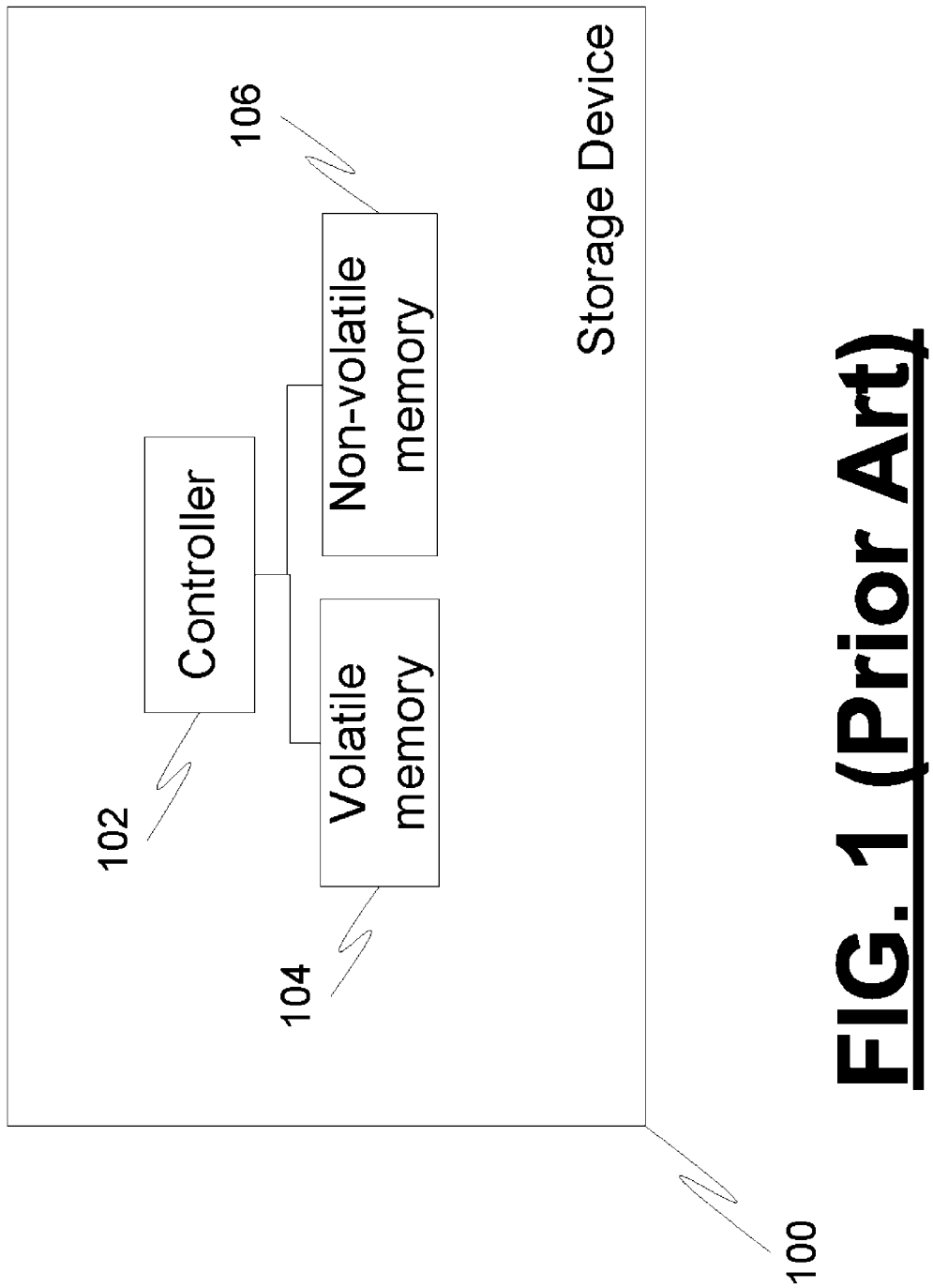
FIG. 1 illustrates an example of a data storage device.
Figure 2:
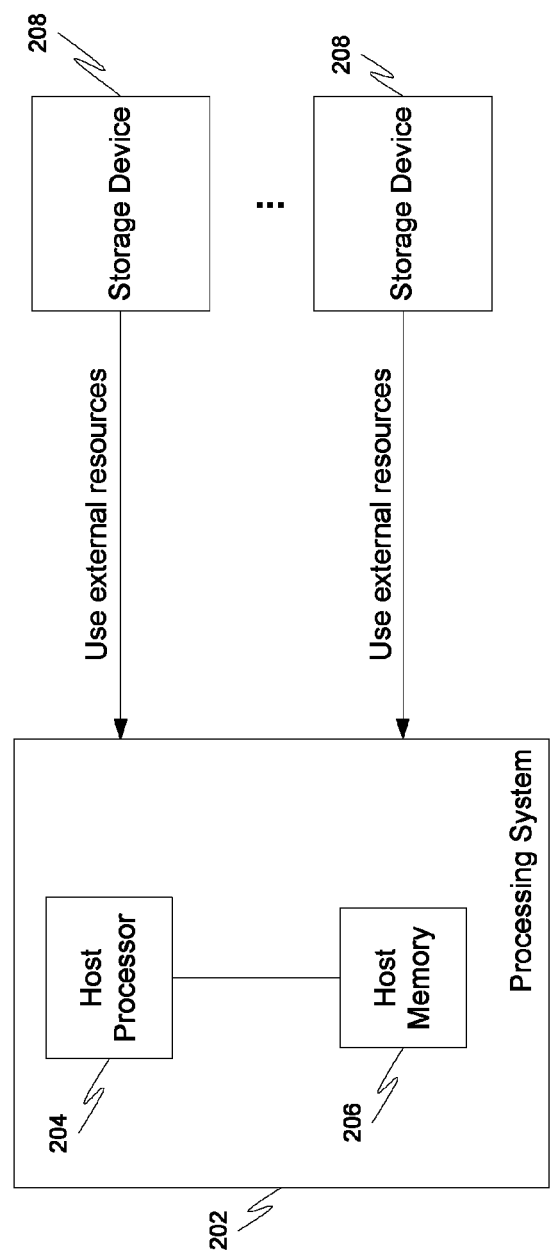
FIG. 2 illustrates an example of data storage devices using external resources.

Data storage devices, such as the device 100 shown in FIG. 1, often do not have sufficient resources for performing data storage operations efficiently. Thus, it is desirable for the data storage devices to use external resources. For example, as shown in FIG. 2, one or more data storage devices 208 may use resources of an external processing system 202 which includes a host processor 204 and a host memory 206 for performing data storage operations. The present disclosure provides two embodiments for such a resource-sharing scheme.

Referring back to FIG. 1, because the FTL metadata is often stored on the non-volatile memory 106, accessing FTL metadata is typically much slower compared to accessing the volatile memory 104. In addition, the FTL metadata is often accessed very frequently because reading or writing user data on the non-volatile memory 106 requires access to the FTL metadata (e.g., reference to the address mapping table). Thus, keeping the entire FTL metadata on the non-volatile memory 106 for access may have negative effects on the performance of the data storage device 100, and also may cause wear problems of the non-volatile memory 106 and reduce the lifespan of the data storage device 100.

One approach to ameliorate such problems is to load the entire FTL metadata to the volatile memory 104 during data storage operations and store the FTL metadata back onto the non-volatile memory 106 at system shutdown. However, the volatile memory 104 often has a limited size. Because the size of the FTL metadata is proportional to the total capacity of the data storage device 100, loading the entire FTL metadata to the volatile memory 104 is often not feasible when the data storage device 100 has a large capacity.

Instead of using a page-level mapping for the FTL, a block-level mapping, which usually requires a smaller mapping table, may be implemented to reduce the size of the FTL metadata in order to load the entire FTL metadata to the volatile memory 104. However, the block-level mapping is often very inefficient (e.g., for frequent random data updates) because the block-level mapping results in coarser mapping granularity compared to the page-level mapping.

Figure 3:
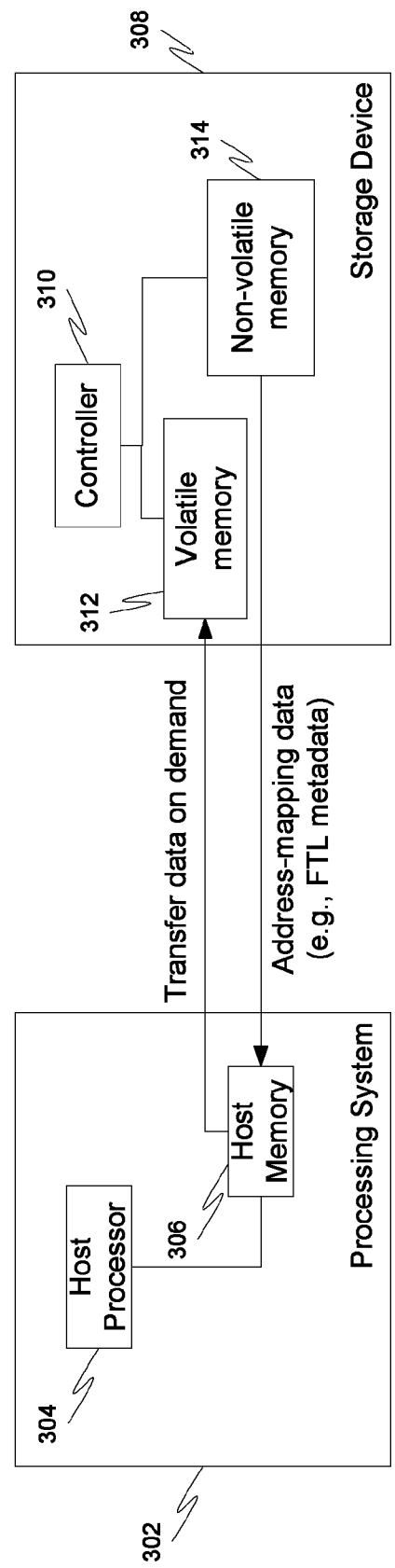
FIG. 3 illustrates an example of loading address-mapping data from a data storage device to an external processing system.

FIG. 3 illustrates an example of loading address-mapping data from a data storage device to an external processing system. As shown in FIG. 3, a data storage device 308 provides address-mapping data (e.g., FTL metadata) to a host memory 306 of an external processing system 302, and the processing system 302 transfers part of the address-mapping data back to the data storage device 308 on demand.

Specifically, the address-mapping data (e.g., FTL metadata) is stored in a non-volatile memory 314 of the data storage device 308. A controller unit 310 of the data storage device 308 transmits the address-mapping data to the host memory 306 which may, for example, include a volatile memory. When the non-volatile memory 314 is to be accessed upon a request, the processing system 302 transfers part of the address-mapping data associated with the request to a volatile memory 312 of the data storage device 308 for processing. As an example, a data item associated with a logical address is to be stored on the data storage device 308. A host processor 304 reads out part of the address-mapping data on the host memory 306 that relates to the logical address, and sends the address-mapping data along with the data item to the volatile memory 312 of the data storage device 308. The controller unit 310 of the data storage device 308 processes the received address-mapping data to obtain a physical address of the non-volatile memory 314 that corresponds to the logical address. Then, the data item is stored to the physical address of the non-volatile memory 314. The address-mapping data (e.g., FTL metadata) on the host memory 306 may be updated during data storage operations, and stored to the non-volatile memory 314 upon system shut-down.

For example, the host memory 306 and the volatile memory 312 may each include DRAM devices, or static-random-access memory (SRAM) devices. The non-volatile memory 314 may, for example, include flash memory devices, phase-change random access memory (PRAM) devices, magnetoresistive RAM (MRAM) devices, resistive RAM (ReRAM) devices, or ferroelectric RAM (FeRAM) devices. The data storage device 308 may communicate with the processing system 302 using an interface protocol, such as peripheral component interconnect-express (PCI-E) protocol, advanced technology attachment (ATA) protocol, serial ATA (SATA) protocol, parallel ATA (PATA) protocol, serial attached SCSI (SAS) protocol, universal serial bus (USB) protocol, multi-media card (MMC) protocol, enhanced small disk interface (ESDI) protocol, or integrated drive electronics (IDE) protocol. As an example, the communication between the data storage device 308 and the processing system 302 through the interface protocol is faster than accessing the non-volatile memory 314. For example, the data storage device 308 communicates with the processing system 302 using the PCI-E protocol. The data transferred between the data storage device 308 and the processing system 302 may be encapsulated in packets. The link between the data storage device 308 and the processing system 302 may include one or more lanes (e.g., 1-32 lanes), and the packet data may be striped across lanes.

Another embodiment of the resource-sharing scheme as shown in FIG. 2 is related to error correction. Referring back to FIG. 1, the controller unit 102 performs error correction to ensure integrity of data written on the data storage device 100. However, under certain circumstances, errors in the data written on the data storage device 100 may exceed the error correction capabilities of the controller unit 102, which may result in unrecoverable data or data loss.

Figure 4:
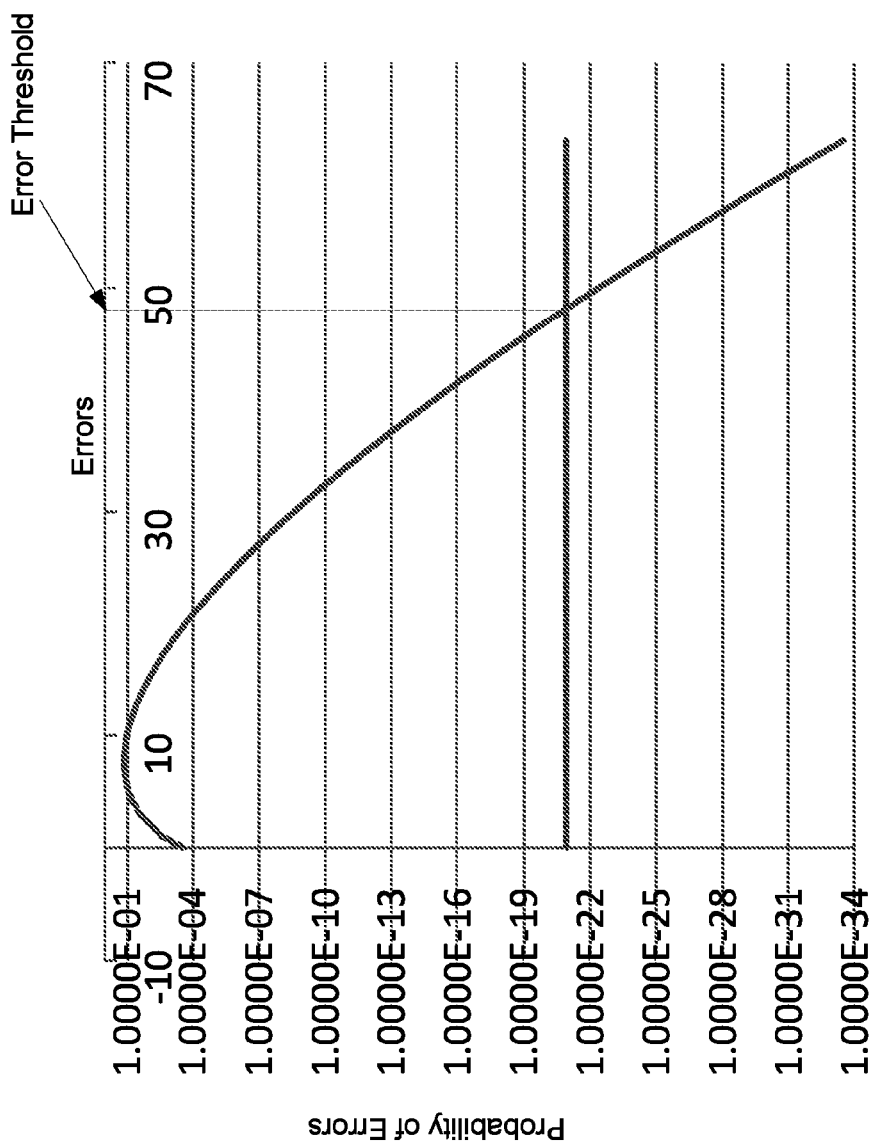
FIG. 4 illustrates an example diagram of a probability of errors associated with a data storage device.

For example, the controller unit 102 may be capable of recovering errors up to a predetermined threshold. Beyond that threshold, the errors are not recoverable, and the data containing these errors may be discarded. As shown in FIG. 4, the predetermined error threshold may be close to 50 bytes/sector, and the probability of errors at or beyond this threshold is very low, e.g., lower than $10^{-19}$. In some circumstances, however, users may want to keep the data even if a large amount of errors (e.g., exceeding the predetermined threshold) occur during the data storage operations. Retaining data with a large amount of errors may often require a much more complicated error correction algorithm and thus much larger error correction codes. It is usually not feasible for the data storage device 100, which has limited processing power and resources, to perform error correction using a very complicated error correction algorithm.

Figure 5:
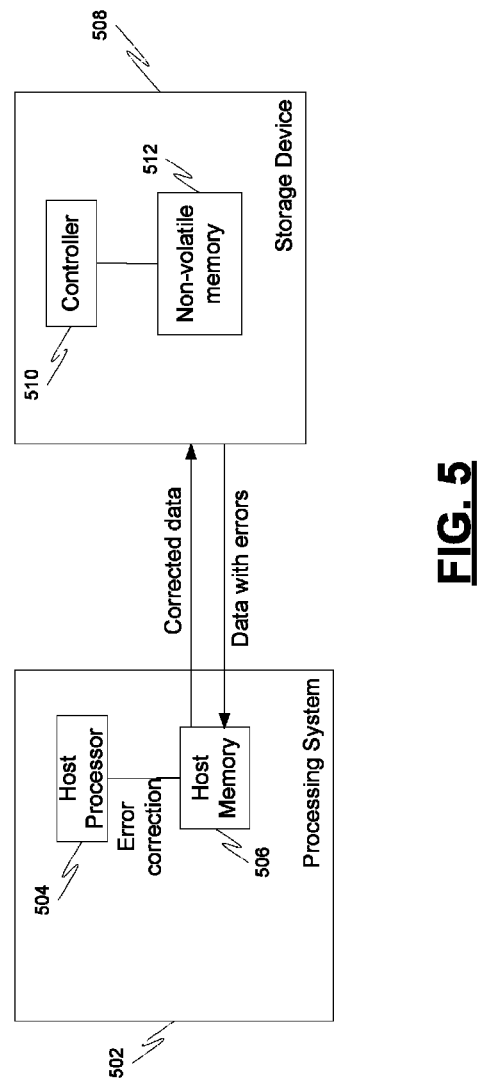
FIG. 5 illustrates an example of using an external processing system to perform error correction for a data storage device.

FIG. 5 illustrates an example of using an external processing system to perform error correction for a data storage device. As shown in FIG. 5, a data storage device 508 (e.g., a SSD) transfers data with errors to an external processing system 502 for error correction, and then the processing system 502 transfers corrected data back to the data storage device 508.

Specifically, a controller unit 510 of the data storage device 508 may detect errors in the data stored on a non-volatile memory 512 of the data storage device 508. The amount of errors in the data may exceed a predetermined error threshold and the controller unit 510 cannot recover data. Because the processing system 502 may have sufficient processing power and resources to correct such errors, the raw data with errors is transferred from the data storage device 508 to the processing system 502. For example, a host processor 504 (e.g., a central processing unit or a graphical processing unit) of the processing system 502 may perform error correction on the data with errors that is received onto a host memory 506 of the processing system 502. Corrected data may be generated after the error correction, and transferred back to the data storage device 508.

For example, if the amount of errors in the data stored in the non-volatile memory 512 does not exceed the predetermined error threshold, the controller unit 510 of the data storage device 508 can perform error correction using Error Correction Code (e.g., Hamming code or Bose-Chaudhuri-Hocquenghem code) or parity operations.

Figure 6:
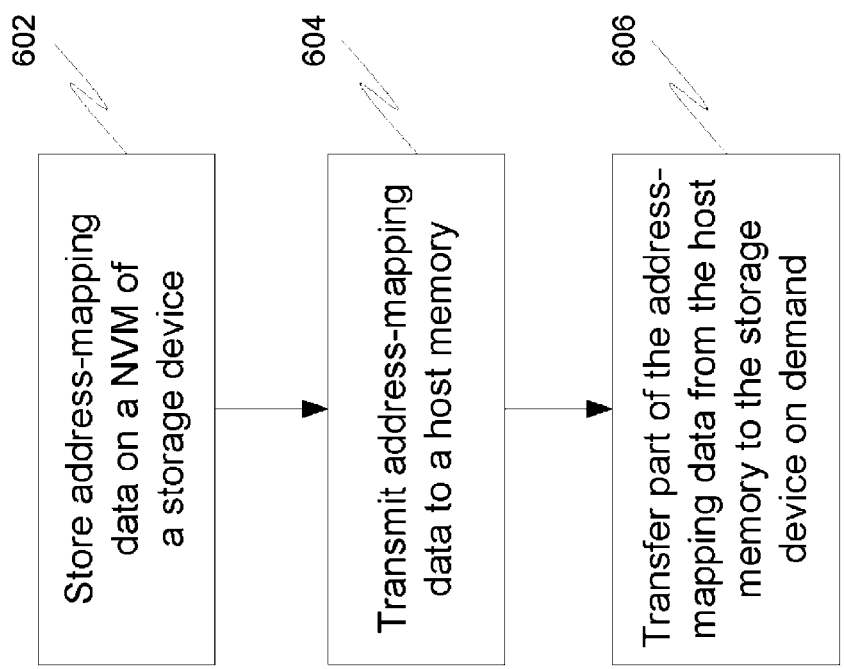
FIG. 6 illustrates an example flow chart for loading address-mapping data from a data storage device to an external processing system.

FIG. 6 illustrates an example flow chart for loading address-mapping data from a data storage device to an external processing system. At 602, address-mapping data is stored on a non-volatile memory of a data storage device. At 604, the address-mapping data is transmitted to a host memory of an external processing system. At 606, part of the address-mapping data can be transferred back to the data storage device on demand for data storage operations. For example, when the non-volatile memory of the data storage device is to be accessed upon a request, part of the address-mapping data associated with the request can be transferred to a volatile memory of the data storage device for processing.

FIG. 7 illustrates an example flow chart for using an external processing system to perform error correction for a data storage device. At 702, data with errors is stored on a non-volatile memory of a data storage device. For example, the amount of errors exceeds a predetermined threshold, and the data storage device does not have sufficient processing power and resources to recover data. At 704, the data with errors is transmitted to an external processing system. A host processor (e.g., a central processing unit or a graphical processing unit) of the processing system is used to perform error correction. At 706, corrected data is generated after the error correction. At 708, the corrected data can be transferred back to the data storage device.

This written description uses examples to disclose the invention, include the best mode, and also to enable a person skilled in the art to make and use the invention. The patentable scope of the invention may include other examples that occur to those skilled in the art.
For example, the systems and methods described herein may be implemented on many different types of processing devices by program code comprising program instructions that are executable by the device processing subsystem. Other implementations may also be used, however, such as firmware or appropriately designed hardware configured to carry out the methods and systems described herein. In another example, the systems and methods described herein may be implemented in an independent processing engine, as a co-processor, or as a hardware accelerator. In yet another example, the systems and methods described herein may be provided on many different types of computer-readable media including computer storage mechanisms (e.g., CD-ROM, diskette, RAM, flash memory, computer's hard drive, etc.) that contain instructions (e.g., software) for use in execution by a processor to perform the methods' operations and implement the systems described herein.

The invention claimed is:

1. A method comprising:
   storing, by a storage device, data with errors;
   if an amount of the errors does not exceed a predetermined threshold, then the storage device performing error correction on the data;
   if the amount of the errors does exceed the predetermined threshold, then
      the storage device transferring the data with the errors to a processing system,
      the processing system performing error correction on the data to generate corrected data, and
      the processing system transferring the corrected data to the storage device;
   storing, by the storage device, address-mapping data indicating mapping from logical addresses of the storage device to physical addresses of the storage device,
   transferring, by the storage device, the address-mapping data to the processing system;
   receiving, by the processing system, the address-mapping data;
   transferring, by the processing system to the storage device, both (i) a data item to be stored at a logical destination address in the storage device and (ii) a part of the received address-mapping data that is associated with mapping the logical destination address to a corresponding physical destination address in the storage device;
   using, by the storage device, the part of the address-mapping data to derive the physical destination address from the logical destination address;
   storing the data item at the physical destination address in the data storage device;
   storing, by the processing system, the received address-mapping data in a host memory of the processing system; and
   upon a system shutdown, transferring, by the processing system, the address-mapping data from the host memory to the data storage device.

2. The method of claim 1, wherein in the storing of the data includes storing the data in a non-volatile memory of the data storage device.

3. The method of claim 1, wherein (i) the transferring from the data storage device to the processing system and (ii) the transferring from the processing system to the data storage device are conducted over serial communication.

4. The method of claim 1, wherein the processing system comprises a graphic processing unit.

5. The method of claim 1, wherein the errors occur during data storage operations of the data by the storage device.

6. An apparatus comprising:
   a processing system; and
   a storage device configured to
      store data with errors,
      if an amount of the errors does not exceed a predetermined threshold, then perform error correction on the data,
      if the amount of the errors does exceed the predetermined threshold, then transfer the data with the errors to the processing system, for the processing system to (i) perform error correction on the data to generate corrected data and (ii) transfer the corrected data to the storage device,
      store address-mapping data indicating mapping-from logical addresses of the storage device to physical addresses of the storage device, and
      transfer the address-mapping data to the processing system: and the processing system configured to
      receive the address-mapping data,
      transfer, to the storage device, both (i) a data item to be stored at a logical destination address in the storage device and (ii) a part of the received address-mapping data that is associated with mapping the logical destination address to a corresponding physical destination address in the storage device, use the part of the address-mapping data to derive the physical destination address from the logical destination address, store the data item at the physical destination address in the data storage device, store the received address-mapping data in a host memory of the processing system, and upon a system shutdown, transfer the address-mapping data from the host memory to the data storage device.

7. The apparatus of claim 6, wherein the storage device includes a non-volatile memory and is configured to store the data in the non-volatile memory.

8. The apparatus of claim 6, wherein the processing system is configured to transfer the part of the address-mapping data to the data storage device over serial communication.

9. The apparatus of claim 6, wherein the processing system comprises a graphic processing unit.

10. The apparatus of claim 6, wherein the errors are errors that occur during data storage operations of the data by the storage device.

* * * * *